June 20, 1967 L. A. HARWOOD 3,327,238
PARALLEL ACTIVE CIRCUIT ELEMENTS WITH PROVISION
FOR POWER DISTRIBUTION
Filed July 10, 1964 2 Sheets-Sheet 1

INVENTOR.
LEOPOLD A. HARWOOD
BY J. L. Whittaker
Attorney

INVENTOR.
LEOPOLD A. HARWOOD
BY J. C. Whittaker
Attorney

United States Patent Office 3,327,238

Patented June 20, 1967

3,327,238

PARALLEL ACTIVE CIRCUIT ELEMENTS WITH PROVISION FOR POWER DISTRIBUTION

Leopold A. Harwood, Cherry Hill, N.J., assignor to Radio Corporation of America, a corporation of Delaware Filed July 10, 1964, Ser. No. 381,626
4 Claims. (Cl. 330—31)

This invention relates to circuits for combining active circuit elements and particularly to circuits for combining semiconductor active devices in high power, high frequency circuits.

The use of semiconductors to supply relatively large amounts of power while operating at high frequencies is accompanied by the problem of the low power handling capacity of semiconductors which are capable of high frequency operation. High frequency transistors, for example, are generally small in size and have a correspondingly low power handling capacity. When it is desired to construct a high power, high frequency semiconductor circuit such as a transistor amplifier, a plurality of semiconductor elements are combined so that each delivers a portion of the total power to the load. A well-known arrangement for accomplishing this combination in a transistor amplifier is to connect the transistors in parallel, i.e. connecting like terminals of the respective transistors together and operating the parallel combination as one high power unit. This approach is similar to that used in paralleling vacuum tubes. However, unlike vacuum tubes, transistors have relatively low input impedances which vary with individual transistors. Such an arrangement in transistor amplifiers has disadvantages due to the variations in the high frequency characteristics of the individual transistors, especially variations in the input impedances of the transistors.

Two of the major problems encountered in the conventional parallel arrangement described above are (1) unequal power distribution among the various semiconductor devices due to variations in the high frequency characteristics of the various devices, and (2) the possibility that oscillations occurring in one or more of the devices will cause their destruction.

The first-mentioned problem arises from a characteristic of semiconductor devices such as transistors that the power dissipated by the device is directly related to the input current drawn by the device. In the case of a transistor amplifier the power is directly related to the base current drawn by the transistor. If an equal voltage is applied between the respective bases and emitters of a plurality of transistors, as in the conventional parallel arrangement, the current distribution among the various transistors will depend on their respective base-emitter impedances. Where one transistor has a low base-emitter impedance it tends to draw more current than one with a high base-emitter impedance. This unequal current distribution causes a corresponding unequal power distribution. In the extreme case the unequal power distribution results in destruction of the transistor.

The second of the above-mentioned problems is a result of the capability of a semiconductor active device, such as a transistor, as an amplifying unit, to oscillate. In high frequency transistors, this problem is critical because of the availability of high frequency feedback paths both in the transistor itself and in the external circuit. Should one transistor of a parallel combination go into an oscillatory state, it is possible that the oscillations will destroy either the oscillating transistor or other transistors in parallel with it which are in effect a load on the oscillating transistor.

The above-mentioned problems exist in any parallel arrangement of semiconductor active circuit elements where the active elements have impedances which in general vary from one element to the next and where the power dissipated by the active element is a function of the current supplied to it. Semiconductor devices, unlike vacuum tubes, have these characteristics and therefore the problem is most acute in active elements of the semiconductor type.

It is therefore an object of the present invention to provide an improved circuit for connecting semiconductor active circuit elements for high power operation.

It is a further object of the present invention to provide a more reliable semiconductor high power amplifer.

A still further object of the present invention is to equalize the power distribution and provide isolation between active elements connected in a parallel configuration.

A still further object is to reduce the probabilities of destruction of transistors in a high frequency parallel transistor amplifier.

The above objects are accomplished by connecting a plurality of semiconductor active circuit elements in a manner such that each supplies power to a common load while each is electrically isolated from the other. For example, in the construction of a high power amplifier according to the present invention, where the individual parallel transistors are connected in a common emitter fashion, the collectors of the various transistors are connected together and through the load to a unidirectional potential source. However, in contrast to the prior art the input circuitry of the amplifier is constructed so that the base of each transistor is connected through an individual impedance element to an impedance element common to all the transistors. The various individual impedance elements resonate with the common impedance element. The input circuit of a broadband, high frequency amplifier may, for example, comprise a single capacitor in shunt across the input and electrically connected to a plurality of inductors, each of which is separately connected to an individual base terminal of a respective transistor. Such an arrangement tends to isolate the various stages from one another as well as equalize the power distribution among the various transistors.

Although the present invention is applicable wherever it is desired to distribute high frequency power substantially equally among a plurality of active circuit elements where variation in the high frequency characteristics of the elements present problems of unequal power distribution or to provide isolation between such elements or both, as pointed out above, the problems of equal power distribution and isolation are particularly acute in parallel transistor amplifiers. Therefore, the invention has been found of particular value in designing parallel transistor amplifiers.

In the following detailed description, particular attention is given to the construction of parallel transistor amplifiers according to the principles of the present invention.

Figure 1:
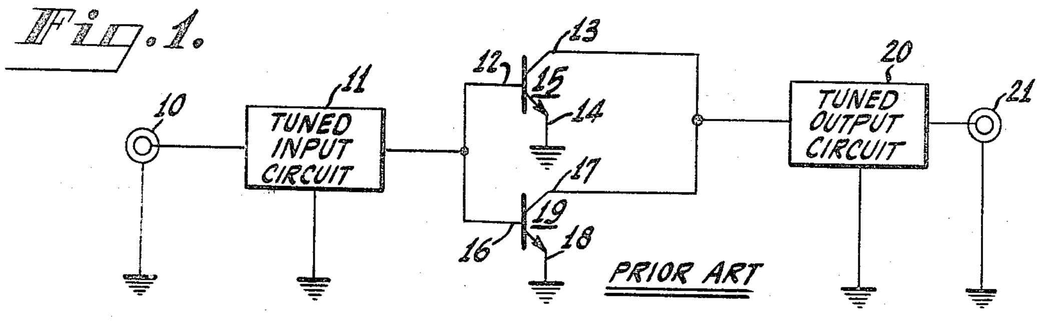
FIG. 1 is a circuit diagram of a conventional prior art tuned amplifier employing parallel transistors.

FIG. 1 shows a high frequency tuned amplifier with a pair of transistors 15 and 19 connected in parallel according to conventional methods. A tuned input circuit 11 is connected between the input terminals 10 of the amplifier and the input terminals 12 and 16 of the respective transistors. Both transistors are connected in a common emitter configuration, both emitters 14 and 18 being connected to ground and both collectors 13 and 17 being connected together and through a tuned output circuit 20 to the output terminals 21 of the amplifier. The bias circuitry of the amplifier has been omitted for the sake of clarity.

The input current distribution between the two transistors 15 and 19 is directly related to the input impedances of the respective transistors 15 and 19. The input impedance of primary concern in the common emitter configuration is the base spreading resistance. If the spreading resistance of the first transistor 15 is smaller than that of the second transistor 19, the current drawn by the first transistor 15 will be greater than that drawn by the second transistor 19. Consequently the power dissipated by the first transistor 15 will be greater than that dissipated by the second transistor 19. Generally, the high frequency characteristics of transistors vary to the extent that it is difficult to choose transistors with equal spreading resistance characteristics. The result is frequently destruction of the transistors due to the unequal power distribution.

The possibility of oscillation in transistors capable of high frequency operation is great due to the availability of high frequency feedback paths which may cause a negative input resistance. In the parallel amplifier of FIG. 1, due to variations in the high frequency characteristics of the two transistors 15 and 19 it is possible that one transistor may exist in a state of oscillation while the other may not. In such a situation the oscillating transistor acts as a source of high frequency power while the non-oscillating transistor acts as a sink for this power. Should the power generated by the oscillating transistor be high enough, the total power dissipated in the non-oscillating transistor might cause its destruction.

Figure 2:
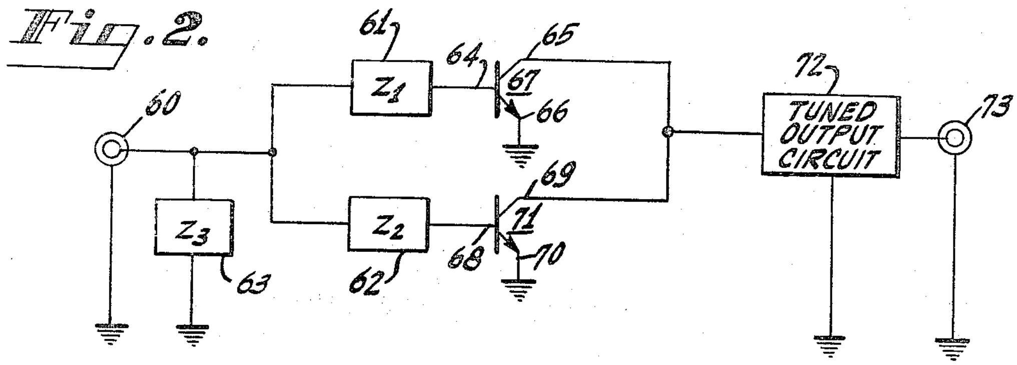
FIG. 2 is a circuit diagram of a tuned amplifier constructed according to the present invention.

The disadvantages of the conventional parallel transistor amplifier described above may be avoided by constructing the amplifier according to the principles of the present invention. Such an amplifier is shown in FIG. 2. The output circuit of the amplifier is identical to that shown in FIG. 1. The collectors 65 and 69 of the two transistors 67 and 71 are connected together and through a tuned output circuit 72 to the output terminals 73 of the amplifier. The two emitters 66 and 70 are connected to ground. The input circuit of the amplifier includes first and second impedances 61 and 62 each individually connected between a respective base 64 or 68 of one transistor and through a third common impedance 63 to ground. The bias circuitry has been omitted for the sake of clarity. Although the present amplifier includes two common emitter stages, any number of transistors may be employed depending on the power requirements.

The first and second input impedances 61 and 62 are chosen to form a pair of series resonant circuits with the third impedance 63 having the desired bandwidth and center frequency, the resonant circuits so formed being effectively arranged in a shunt configuration. The first and second impedances 61 and 62 may, for example, take the form of two equal inductors and the third impedance 63 may be a capacitor. The first and second impedances 61 and 62 should be relatively high compared to the input impedances of the transistors 67 and 71 at the frequency of operation in order that the current distribution between the two transistors 67 and 71 will be substantially independent of the input impedances of the two transistors. The first and second impedances 61 and 62 should be equal in value so that the current supplied to the two transistors 67 and 71 will be substantially equal. In the preferred embodiment the two identical impedances 61 and 62 will take the form of inductors. This is so because it is generally easier to construct two equal inductors than it is to construct two equal capacitors. Also, the use of inductors has been found to result in a somewhat more stable circuit.

The input current distribution between the two transistors 67 and 71 is determined primarily by the values of the first and second impedances 61 and 62 which, at the frequency of operation, are large compared to the input resistances of the two transistors. Therefore, any variations in the input resistances of the respective transistors 67 and 71 will have very little effect on the input current supplied to the two transistors 67 and 71. The power dissipated by the first transistor 67 will, therefore, be substantially equal to that dissipated by the second transistor 71, regardless of variation of input resistances.

Should it be desired to increase the total power supplied by the amplifier, a third transistor may be added with an impedance equal to the first and second impedances 61 and 62 connected between its base and the common impedance 63. The common impedance element 63 should then be adjusted to obtain the desired resonant frequency. The bandwith of the amplifier remains the same without any re-design in the existing circuits.

It has been found that the individual transistor stages of the present amplifier arrangement are more stable than those of the conventional parallel transistor amplifier described with respect to FIG. 1 above when the amplifier is broadbanded and when the two impedance elements 61 and 62 are inductors. However, it is still possible that one of the transistor stages of the present amplifier may, under certain circumstances, go into a state of oscillation. Should such a condition occur, the danger of the oscillating transistor destroying a non-oscillating transistor is reduced in the present amplifier from that which existed in prior art amplifiers such as that described above with reference to FIG. 1. This is due to the isolation between the individual transistors 67 and 71 afforded by the impedance elements 61 and 62 placed between the bases 64 and 68 of the two transistors 67 and 71.

Figure 3:
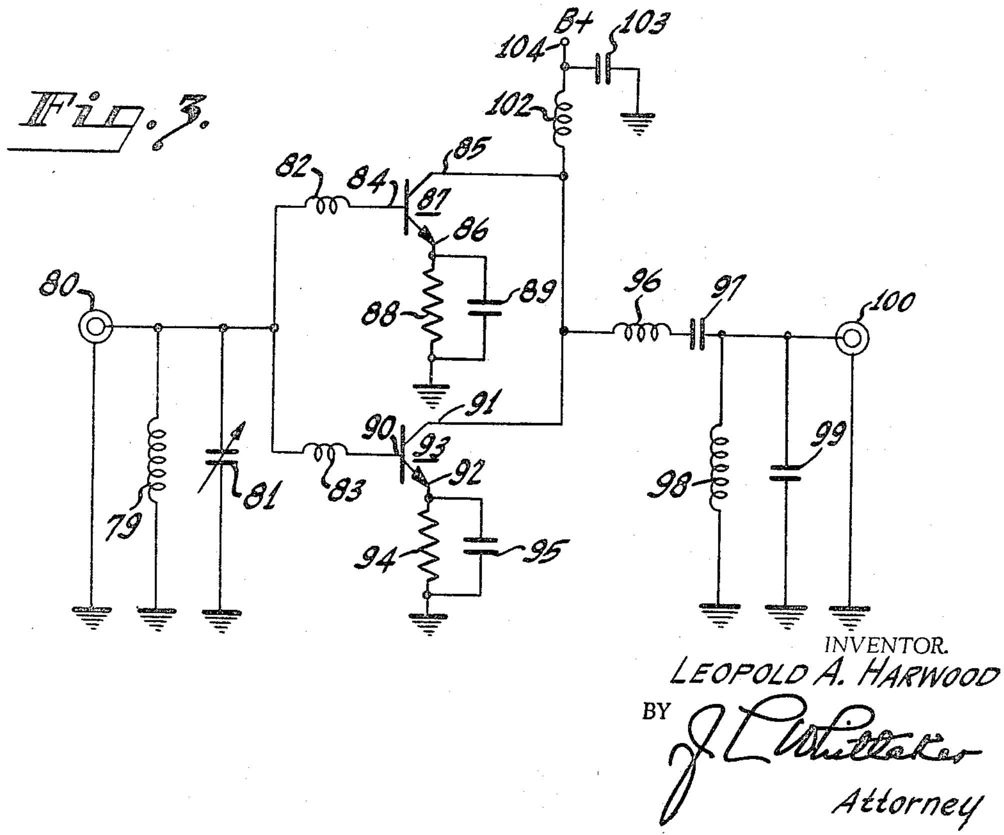
FIG. 3 is a circuit diagram of a wide band, very high frequency tuned amplifier employing the principles of the present invention.

FIGURE 3 is a circuit diagram of a VHF (very high frequency) power amplifier constructed according to the present invention. The input terminal 80 is connected to the respective base terminals 84 and 90 of the two transistors 87 and 93 through two equal valued inductors 82 and 83. A shunt capacitor 81, connected between the input terminal 89 and ground, completes a separate series resonant circuit with each of the two inductors 82 and 83. An RF choke 79 is connected between the input terminal 80 and ground. The emitter 86 of the transistor 87 is connected through a biasing resistor 88 and a bypass capacitor 89 to ground. The emitter 92 of the transistor 93 is similarly connected through a resistor 94 and a capacitor 95 to ground. The two collectors 85 and 91 of the two transistors are connected together and through an inductor 102 to a source of positive potential 104. A filter capacitor 103 is connected between the source and ground. The output of the amplifier is taken from the common collector point through a suitable tuning circuit including two inductors 96 and 98 and two capacitors 97 and 99.

The input capacitor 81 forms a resonant circuit with the two inductors 82 and 83. Thus, the center frequency of the circuit is determined by the capacitance of the capacitor 81 and the equivalent inductance of the two inductors 82 and 83 in parallel. At the frequencies of operation the impedance offered by the inductor 82 is large compared to the input resistance of the transistor 87. The same is true of the inductor 83 and transistor 93. Therefore, any variation in the input resistances of the two transistors 87 and 93 has little effect on the current distribution between the two transistors. Therefore, the power dissipated by each of the two transistors 87 and 93 is substantially independent of the input resistance of the respective transistor.

If one of the two transistors 87 or 93 goes into a state of oscillation, the other transistor, which may not be oscillating, is effectively isolated from the oscillating transistor by the two inductors 82 and 83. The power dissipated in the non-oscillating transistor is thereby limited and the danger of destruction due to effective high frequency power dissipation is correspondingly reduced.

Should it be necessary to increase the power supplied by the amplifier, a third transistor stage may be added. The third transistor should be of the same type as the two transistors 87, 93 and should include an inductor equal in value to the two inductors 82 and 83. The capacitor 81 is then adjusted to compensate for the decrease in equivalent inductance introduced by the addition of the third stage. Proper tuning by adjustment of the capacitor 81 results in substantially the same bandwidth as existed prior to the addition of the third stage.

Figure 4:
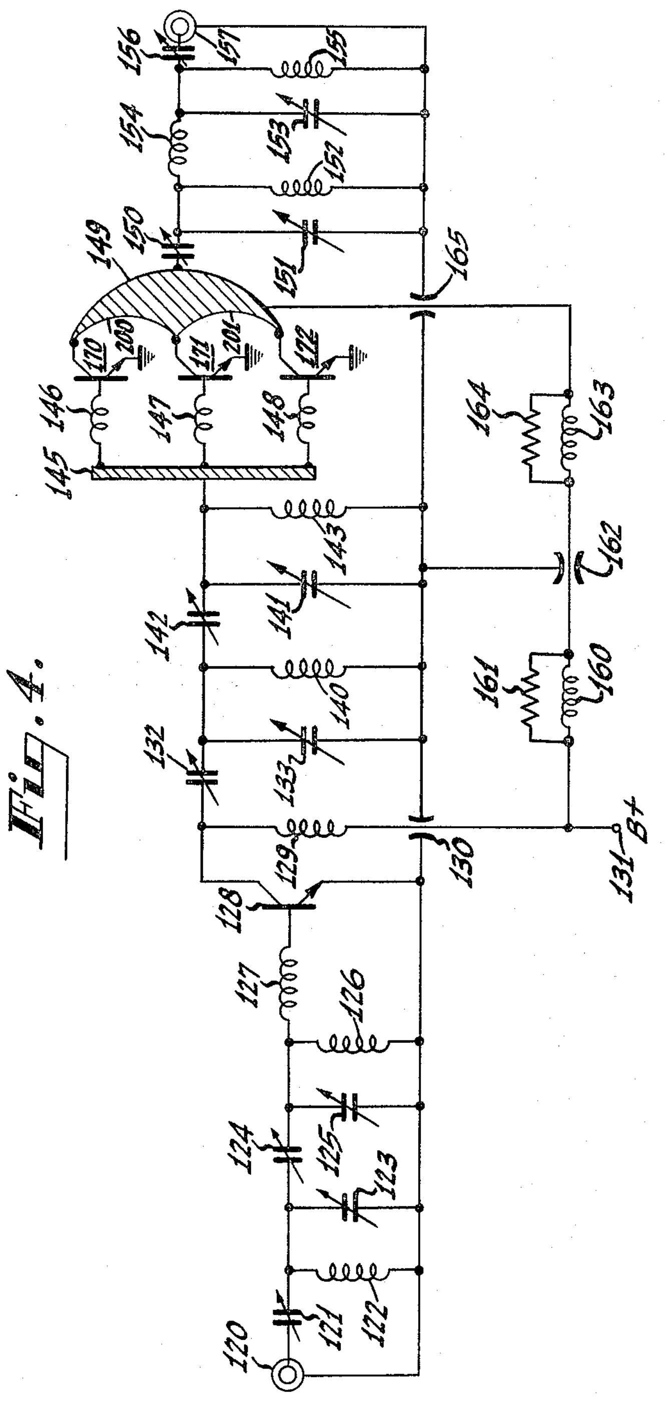
FIG. 4 is a circuit diagram of an ultra-high frequency amplifier constructed according to the present invention.

FIGURE 4 is a circuit diagram of a UHF (ultra-high frequency) two stage amplifier embodying the present invention. The input terminals 120 are connected through a first coupling capacitor 121 to a first parallel resonant circuit comprising an inductor 122 and a variable capacitor 123 which form a primary tuned circuit of the double tuned circuit forming the input of the first transistor stage. A coupling capacitor 124 is connected between the first resonant circuit and a second resonant circuit comprising a variable capacitor 125 and an inductor 127 connected to the base of a first transistor 128. An RF choke 126 is connected across the capacitor 125. A D.C. potential is supplied to the collector of the first transistor 128 from one terminal of a source of direct current 131 through a feed-through capacitor 130 and a RF choke 129. The output of the first stage, taken from the collector of the first transistor 128, is supplied through a double tuned circuit to the second transistor stage. The collector of the first transistor 128 is coupled to the primary resonant circuit which includes a variable capacitor 133 and an inductor 140, through a variable capacitor 132. Coupling between the primary resonant circuit and the secondary resonant circuit is accomplished by a variable coupling capacitor 142. The secondary resonant circuit comprises a variable capacitor 141 connected in series with the parallel combination of the three equal inductors 146, 147 and 148 which are connected to the respective bases of the three transistors 170, 171 and 172. An RF choke 143 is connected across the capacitor 141. The three equal inductors 146, 147 and 148 are electrically connected together at a metallic plate 145. The purpose of using the plate 145 is to avoid inductances which might result from connecting the three inductors with wire. The collectors of the three transistors 170, 171 and 172 are likewise electrically connected together at a metallic plate 149. The construction of the plate 149 is such that the inductance introduced by the plate 149 is negligible. The recessed areas, 200 and 201 in the plate 149 act to reduce the capacitance between the base plate 145 and the collector plate 149. The reduction is due to the increased spacing between the two plates 145 and 149 caused by the recessed areas 200 and 201. Power is supplied to the three transistors 170, 171 and 172 from the positive source terminal 131 through a first parallel combination of a resistor 161 and a RF choke and a second parallel combination of a resistor 164 and RF choke 163. A feed-through filter capacitor 16 2is connected at the common point of the two parallel circuits and ground. A second feed-through capacitor 165 also supplies a filtering effect. The output of the second stage is taken from the common collector plate 149 through a third double tuned circuit comprising a first parallel resonant circuit including a variable capacitor 151 and an inductor 152 and a second parallel resonant circuit comprising the variable capacitor 153 and an inductor 155. The coupling capacitor 150 is connected between the first parallel resonant circuit and the collector plate 149. Inductive coupling is provided between the two parallel resonant circuits by the inductor 154. A variable output coupling capacitor 156 is included for matching purposes.

Input signals to the UHF amplifier of FIG. 4 are supplied from a source (not shown) to the input terminals 120. The first series capacitor 121 is adjusted to match the impedance of the source to that of the double tuned circuit in the input of the first amplifier stage. The desired frequency characteristics of the first double tuned circuit are obtained by tuning the three capacitors 123, 124 and 125 of the double tuned circuit. The first transistor 128 provides an initial amplification. The output signal, taken from the collector of the transistor 128, is supplied to a second double tuned circuit, similar in design to the first, through a matching capacitor 132. The desired frequency characteristics of this second double tuned circuit are obtained through adjustment of the three capacitors 133, 141 and 142. The secondary resonant circuit of the double tuned circuit between the first and second stages comprises the capacitor 141 connected in series with the equivalent inductance of the parallel combination of the three equal inductors 146, 147 and 148. The impedance offered by each of the three inductors 146, 147 and 148 should be relatively high at the frequency of operation compared to the input impedances of each of the three transistors 170, 171, 172. Thus, the current distribution between the three transistors 170, 171 and 172 will be substantially independent of the values of the respective input impedances of the three transistors and each transistor will supply an equal amount of power. Furthermore, should one of the transistors go into a state of oscillation, for example while the amplifier is being tuned, the other two transistors will be effectively isolated from the oscillating transistor by the inductors included in each base circuit. Thus, each of the three transistors 170, 171 and 172 are protected against destruction from the effects of unequal current distribution and oscillation. The output signal from the second stage is taken from the common collector plate 149 through the matching capacitor 150 to a double tuned circuit comprising the two capacitors 151 and 153 and the three inductors 152, 154 and 155. An output matching capacitor 156 is provided to match the output impedance of the amplifier to that of the load.

What is claimed is:

1. An amplifier for translating an input signal at a selected frequency comprising,
   (a) a plurality of transistors each of the same conductivity type and each having a base, an emitter, and a collector,
   (b) means connecting said emitters together and to a point of reference potential,
   (c) a low inductance plate of conducting material,
   (d) a plurality of equal inductive elements,
   (e) means connecting each of said inductance elements between a different point on one side of said plate and a base of a respective one of said transistors to form a plurality of separate parallel paths each having one of said plurality of inductive elements connected to the base of a respective one of said transistors,
   (f) a capacitive impedance element capable of resonance with said plurality of inductive elements upon the application thereto of said input signal at said input signal at said selected frequency,
   (g) means connecting said capacitive element between a point on an opposite side of said plate and a point of reference potential in a manner to couple said capacitive element to said plurality of inductive elements via said plate and form with said plurality of inductive elements a series resonant input circuit resonant at said selected frequency of said input signal,
   (h) a second plate of conducting material,
   (i) means connecting said collectors to different points on said second plate of conducting material,
   (j) said second plate of conducting material having a geometrical configuration such that said different points at which said collectors are connected to said second plate are in relatively close proximity to said first mentioned plate compared to the remaining portions of said second plate,
   (k) means for electrically connecting a point on said remaining portion of said second plate to a source of unidirectional potential and for electrically connecting a load between a different point on said remaining portion of said second plate and a point of reference potential, (l) means connected to said opposite side of said first mentioned plate and arranged to supply said input signals across said capacitive element.

2. An amplifier circuit for translating an input signal at a selected frequency comprising:

(a) a plurality of current conducting devices each having an input terminal and an output terminal, said devices having inherently different input impedances providing unequal current distribution in said devices and consequently unequal power dissipation in said devices upon the application of said input signal to said input terminals, (b) means electrically connecting said output terminals to a common load, (c) a plurality of reactances of equal value, (d) means connecting each of said reactances over a separate path to a respective one of said input terminals to form a plurality of separate parallel paths each having one of said plurality of reactances connected to an input terminal of a respective one of said devices, (e) a single reactance element coupled to said plurality of reactances into a manner to form with said plurality of reactances a series resonant input circuit resonant at said selected frequency of said input signal upon the application thereto of said input signal, (f) means to supply said input signal to said series resonant input circuit, (g) each of said plurality of reactances having impedance values of a magnitude greater than that of said input impedances of said devices at said selected frequency to cause said current distribution through said devices in response to said input signal to be independent of said input impedances.

3. The amplifier circuit described in claim 2 wherein said plurality of reactances are inductors and said single reactance element is a capacitor.

4. A board band high frequency power amplifier circuit for translating input signals at a selected high frequency comprising:

(a) a plurality of transistors of the same conductivity type each having an input electrode, output electrode and a common electrode, each of said transistors having inherently different input impedances providing unequal current distribution in said transistors and consequently unequal power dissipation in said transistors upon the application of said input signal to said input terminals, (b) means connecting said output electrodes to a common load, (c) means for supplying operating bias potentials to said electrodes of said transistors, (d) a plurality of inductive elements each individually coupled at one end to one of said input electrodes with the opposite ends of said inductive elements connected together, (e) a single capacitive element coupled to said inductive elements at said common connection thereof to form with said inductive elements a series resonant input circuit resonant at said selected frequency of said input signal upon the application thereto of said input signal, (f) means connected to the junction between said capacitive element and said inductive elements to supply said input signal across said capacitive element, (g) each of said inductive elements having impedance values of a magnitude greater than that of said input impedance of said transistors at said selected frequency to cause the current distribution through said transistors in response to said input signal to be independent of said input impedances.

References Cited

UNITED STATES PATENTS

| | | | |
|---|---|---|---|
| 2,857,517 | 10/1958 | Jorgensen et al. | |
| 2,873,367 | 2/1959 | Zawels | 329—141 X |

ROY LAKE, *Primary Examiner.*

F. D. PARKS, N. KAUFMAN, *Assistant Examiners.*